(12) United States Patent
James

(10) Patent No.: US 6,281,684 B1
(45) Date of Patent: *Aug. 28, 2001

(54) TECHNIQUE AND APPARATUS TO MEASURE CELL VOLTAGES OF A FUEL CELL STACK USING DIFFERENT GROUND REFERENCES

(75) Inventor: David E. James, Latham, NY (US)

(73) Assignee: Plug Power Inc., Latham, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/629,003

(22) Filed: Jul. 31, 2000

Related U.S. Application Data

(63) Continuation-in-part of application No. 09/472,649, filed on Dec. 27, 1999.

(51) Int. Cl.[7] .................................................. G01N 27/416
(52) U.S. Cl. ........................................... 324/434; 320/120
(58) Field of Search ................................ 320/116, 117, 320/119, 120, 122, FOR 114, FOR 116; 324/425, 426, 430, 433, 434

(56) References Cited

U.S. PATENT DOCUMENTS

| | | |
|---|---|---|
| 3,872,457 | 3/1975 | Ray et al. . |
| 4,484,140 | 11/1984 | Dieu . |
| 5,170,124 | 12/1992 | Blair et al. . |
| 5,578,927 | 11/1996 | Perelle . |
| 5,617,004 * | 4/1997 | Kaneko ................................ 320/119 |
| 5,648,713 * | 7/1997 | Mangez ............................ 320/119 X |
| 6,020,717 * | 2/2000 | Kadouchi et al. .................... 320/116 |
| 6,133,709 * | 10/2000 | Puchianu .............................. 320/116 |
| 6,140,820 * | 10/2000 | James ............................... 320/120 X |

FOREIGN PATENT DOCUMENTS 918 363 A1   5/1999   (EP) .

* cited by examiner

Primary Examiner—Edward H. Tso
(74) Attorney, Agent, or Firm—Trop, Pruner & Hu, P.C.

(57) ABSTRACT

A system that is usable with a stack of fuel cells that have cell terminals includes a circuit and scanning units. The circuit provides a selection signal that indicates selection of at least one of the fuel cells for a voltage measurement. The scanning units are coupled to the stack to establish different groups of the fuel cells. Each group is associated with a different one of the scanning units, and each scanning unit has a ground that is referenced to a different one of the cell terminals. Each scanning unit is adapted to, in response to the selection signal, measure and indicate a voltage of each selected fuel cell within the group of fuel cells associated with the scanning unit.

29 Claims, 7 Drawing Sheets

TECHNIQUE AND APPARATUS TO MEASURE CELL VOLTAGES OF A FUEL CELL STACK USING DIFFERENT GROUND REFERENCES

This application is a continuation-in-part of U.S. patent application Ser. No. 09/472,649, entitled, "MEASURING CELL VOLTAGES OF A FUEL CELL STACK," filed on Dec. 27, 1999.

BACKGROUND

The invention relates to measuring cell voltages of a fuel cell stack.

A fuel cell is an electrochemical device that converts chemical energy produced by a reaction directly into electrical energy. For example, one type of fuel cell includes a proton exchange membrane (PEM), often called a polymer electrolyte membrane, that permits only protons to pass between an anode and a cathode of the fuel cell. At the anode, diatomic hydrogen (a fuel) is reacted to produce hydrogen protons that pass through the PEM. The electrons produced by this reaction travel through circuitry that is external to the fuel cell to form an electrical current. At the cathode, oxygen is reduced and reacts with the hydrogen protons to form water. The anodic and cathodic reactions are described by the following equations:

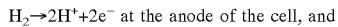
$H_2 \rightarrow 2H^+ + 2e^-$ at the anode of the cell, and

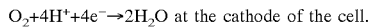
$O_2 + 4H^+ + 4e^- \rightarrow 2H_2O$ at the cathode of the cell.

Because a single fuel cell typically produces a relatively small voltage (around 1 volt, for example), several fuel cells may be formed out of an arrangement called a fuel cell stack to produce a higher voltage. The fuel cell stack may include plates (graphite composite or metal plates, as examples) that are stacked one on top of the other, and each plate may be associated with more than one fuel cell of the stack. The plates may include various channels and orifices to, as examples, route the reactants and products through the fuel cell stack. Several PEMs (each one being associated with a particular fuel cell) may be dispersed throughout the stack between the anodes and cathodes of the different fuel cells.

The health of a fuel cell stack may be determined by monitoring the individual differential terminal voltages (herein called cell voltages) of the fuel cells. In this manner, a particular cell voltage may vary under load conditions and cell health over a range from −1 volt to +1 volt. The fuel cell stack typically may include a large number of fuel cells, and thus, common mode voltages (voltages with respect to a common voltage (ground)) of the terminals of the fuel cells may be quite large (i.e., some of the voltages of the terminals may be near 100 volts, for example). Unfortunately, semiconductor devices that may be used to measure the cell voltages typically are incapable of receiving high common mode voltages (voltages over approximately 18 volts, for example). One solution may be to use resistor dividers to scale down the terminal voltages. However, the tolerances of the resistors may introduce measurement errors.

SUMMARY

In an embodiment of the invention, a system that is usable with a stack of fuel cells that have cell terminals includes a circuit and scanning units. The circuit provides a selection signal that indicates selection of at least one of the fuel cells for a voltage measurement. The scanning units are coupled to the stack to establish different groups of the fuel cells. Each group is associated with a different one of the scanning units, and each scanning unit has a ground that is referenced to a different one of the cell terminals. Each scanning unit is adapted to, in response to the selection signal, measure and indicate a voltage of each selected fuel cell within the group of fuel cells associated with the scanning unit.

Advantages and other features of the invention will become apparent from the following description, from the drawing and from the claims.

DETAILED DESCRIPTION

Figure 1:
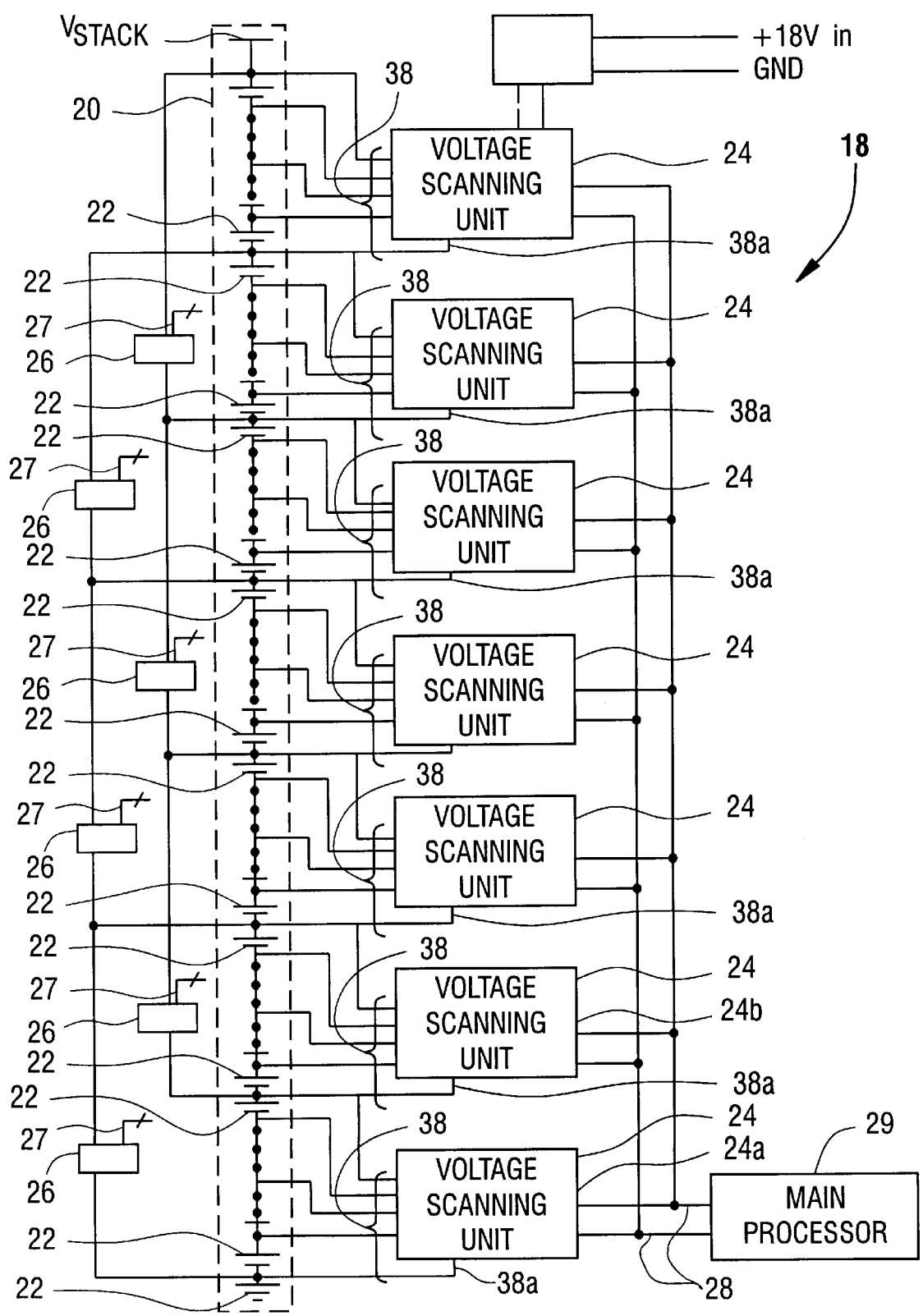
FIG. 1 is a schematic diagram of a circuit to measure fuel cell voltages according to an embodiment of the invention.

Referring to FIG. 1, an embodiment 18 of a fuel cell voltage monitoring circuit in accordance with the invention measures the voltages (herein referred to as cell voltages) of fuel cells 22 of a fuel cell stack 20. Unlike conventional arrangements, the circuit 18 divides the task of measuring the cell voltages among voltage scanning units 24 that may have ground references at potentials greater than a ground reference 23 of the fuel cell stack 20. Due to this arrangement, the circuit 18 may measure the cell voltages that are associated with large common mode voltages (with respect to the ground reference 23), as further described below.

More particularly, each voltage scanning unit 24 measures the cell voltages of a different group of the fuel cells 22 and furnishes indications of the measured voltages to a main processor 29 that may, for example, determine the minimum cell voltage of the stack 20, the maximum cell voltage of the stack 20 and/or the average cell voltage of the stack 20 from the measured cell voltages; and the main processor 29 may communicate these determined values to other circuitry that controls operation of the stack 20 based on these values.

To measure a particular cell voltage, the corresponding voltage scanning unit 24 performs a differential voltage measurement across two terminals 38 (i.e., a positive terminal and a negative terminal) of the cell 22. Thus, each voltage scanning unit 24 receives the voltages of the terminals 38 of the cells 22 of its group and uses these terminal voltages to measure the corresponding cell voltages. The farther (in terms of the relative potential) a particular terminal 38 is from the ground reference 23 of the stack 20, the higher the common mode voltage with respect to the ground reference 23. For example, near the top of the stack 30 (farthest from the ground reference 23), the common mode voltage of a particular terminal 38 may be near one hundred volts with respect to the ground reference 23.

However, due to the grounding of the voltage scanning units 24, the scanning units do not experience such high common mode voltages. Instead, the voltage scanning units 24 may have grounds that are referenced to terminals 38 that have voltages above the ground reference 23. In particular, in some embodiments, each voltage scanning unit 24 has a ground that is coupled to one of the terminals 38 of its associated group of fuel cells 22. Therefore, regardless of the size of the stack 20, each voltage scanning unit 24 only "sees" its associated group of cells, as the position of the group in the stack 20 does not affect the associated common mode voltages. Thus, no voltage scanning unit 24 experiences a high terminal voltage with respect to its ground. As a result of this arrangement, each voltage scanning unit 24 is modular, and the voltage monitoring circuit 18 may be formed by fewer or less voltage scanning units 24 than are depicted in FIG. 1.

As an example, in some embodiments, the voltage monitoring circuit 18 may include seven (as an example) voltage scanning units 24 that divide the stack 20 into seven non-overlapping groups of fuel cells 22. For this example, the number of fuel cells 22 in each group may be approximately sixteen, and it is assumed for this example that each cell voltage is approximately one volt. The group of sixteen fuel cells 22 that are closest to the ground reference 23 may form a group of fuel cells 22 that are scanned by the voltage scanning unit 24a. Because of the relatively low voltages (i.e., voltages less than or equal to approximately sixteen volts, for example) of the terminals 38 of this group with respect to the ground reference 23, the ground of the voltage scanning unit 24a is coupled to the ground reference 23.

Continuing the example above, the next (with respect to the ground reference 23) group of sixteen fuel cells 22 form a group of cells 22 that are measured by the voltage scanning unit 24b. The terminals 38 from this group have much larger voltages (i.e., voltages between approximately 16 and 32 volts, for example) with respect to the ground reference 23, and such large common mode voltages may exceed the maximum common mode voltage that may be received by semiconductor devices (described below) that form the voltage scanning unit 24b. However, to avoid this problem, the lowest voltage terminal 38 (relative to the ground reference 23) of the group forms the ground for the voltage scanning unit 24b. As a result, the voltage scanning unit 24b experiences approximately the same common mode voltages as the voltage scanning unit 24a. Similarly, the other voltage scanning units 24 experience approximately the same common mode voltages, as the ground of each voltage scanning unit 24 is coupled to the cell terminal 38 that has the lowest voltage (with respect to the ground reference 23) of the terminals of the associated group of fuel cells 22.

Besides the voltage scanning units 24 and the main processor 29, the voltage monitoring circuit 18 may also include voltage regulators 26 to furnish operating power to the voltage scanning units 24. In this manner, in some embodiments, each voltage regulator 26 provides one or more regulated supply voltages (via power supply line(s) 27) to a different one of the voltage scanning units 24. The ground of each voltage regulator 26 is connected to the same ground as the voltage scanning unit 24 to which the voltage regulator 26 supplies power. As depicted in FIG. 1, the voltage regulator 26 may receive power from more than one (two, for example) groups of fuel cells 22.

Among the other features of the voltage monitoring circuit 18, in some embodiments, the main processor 30 and the voltage scanning units 24 are coupled together via a serial bus 28. In this manner, the serial bus 28 may include, for example, a transmit (TX) line and a receive (RX) line for purposes of establishing communication between the main processor 29 and the voltage scanning units 24. In some embodiments, each voltage scanning unit 24 has a different serial bus address, and the main processor 29 queries (via the serial bus 28) each voltage scanning unit 24 for indications of the measured cell voltages from its groups. In some embodiments, the main processor 29 may retrieve indications of the measured voltages from each voltage scanning unit 24 several times a second, as an example. In other embodiments of the invention, each voltage scanning unit 24 may be directly connected to the main processor 29 via a different associated communication line. Other variations are possible.

Figure 2:
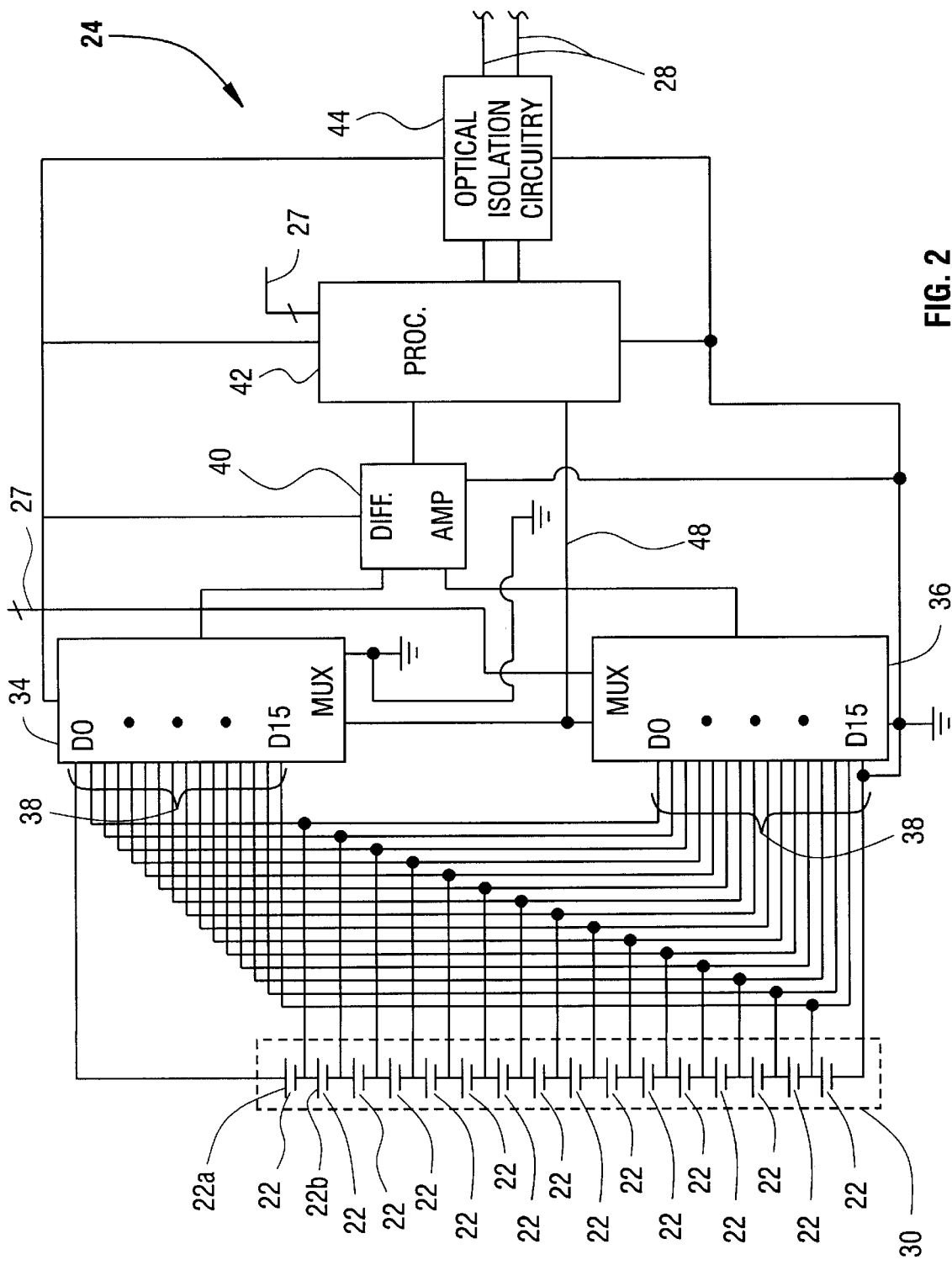
FIG. 2 is a schematic diagram of a scanning unit of the circuit of FIG. 1 according to an embodiment of the invention.

FIG. 2 depicts one of many possible embodiments of the voltage scanning unit 24 along with an associated group 30 of fuel cells. As shown, the voltage scanning unit 24, in some embodiments, includes a differential amplifier 40 that measures the cell voltages of the group 30 one at a time. In this manner, to measure a particular cell voltage, the differential amplifier 40 receives a voltage that is indicative of the positive terminal of the cell 22 and a voltage that is indicative of the negative terminal of the cell 22. The amplifier 40 takes the difference of these two voltages to form an analog signal that is furnished to a processor 42 of the voltage scanning unit 24.

In some embodiments, the processor 42 may be a microcontroller, for example, that includes an analog-to-digital converter (ADC) to convert the analog signal that is furnished by the amplifier 40 into a digital value. In this manner, the processor 42 may also include or be coupled to a random access memory (RAM) to store the digital values that indicate the measured cell voltages for all of the cells in the group 30. When the voltage scanning unit 24 is queried by the main processor 29 (see FIG. 1) for the measured voltages, the processor 42 communicates (via optical isolation circuitry 44) with the main processor 29 over the serial bus 28 to transmit indications of the stored digital values to the main processor 29.

In some embodiments, the processor 42 may operate multiplexing circuitry to selectively control which cell voltage is being measured by the amplifier 40. In this manner, the processor 42 may use control lines 48 to select one cell 22 at a time for measurement using two analog multiplexers 34 and 36. The output terminals of the multiplexers 34 and 36 are coupled to the positive and negative input terminals, respectively, of the amplifier 40. More particularly, in some embodiments, input terminals D0–D15 of the multiplexer 34 are connected to the terminals 38 of the group 30 that have the sixteen highest voltages, and the input terminals D0–D15 of the multiplexer 36 are connected to the terminals 38 of the group 30 that have the sixteen lowest voltages. Thus, due to this arrangement, the processor 42 may obtain a voltage of a particular cell 22 by causing the multiplexer 34 to select the positive terminal of the particular cell 22 and by causing the multiplexer 36 to select the negative terminal of the particular cell 22.

For example, when the processor 42 causes the control lines 48 to indicate "0000b" (where the suffix "b" denotes a binary representation), the multiplexer 34 couples the positive terminal of the cell 22a to the positive input terminal amplifier 40, and the multiplexer 36 couples the negative terminal of the cell 22a to the negative input terminal of the amplifier 40. As another example, when the processor 42 causes the control lines 48 to indicate "0001b", the multiplexer 34 couples the positive terminal of the cell 22b to the positive input terminal of the amplifier 40, and the multiplexer 36 couples the negative terminal of the cell 22b to the negative input terminal of the amplifier 40. Thus, as depicted by these examples, the processor 42 may selectively assert signals on the control lines 48 to sequentially measure the cell voltages of the group 30.

As depicted in FIG. 2, in some embodiments, the multiplexers 34 and 36, the differential amplifier 40, the processor 42 and the optical isolation circuitry 44 receive supply voltages via the power lines 27 from the voltage regulator 26 (see FIG. 1) that is associated with the group 30; and these circuits are connected to the ground that is established by the lowest voltage terminal of the group 30.

As an example, the stack 20 may furnish large common mode voltages that may exceed the ratings of the circuitry of the voltage scanning unit 24. For example, the multiplexer 34, 36 is capable of receiving input voltages up to its power supply level that has a maximum value of eighteen volts, and as another example, the differential amplifier 40 is capable of input voltages up to its power supply voltage that may have a maximum value of approximately thirty volts. However, with the ground referencing that is described above, the ratings of this circuitry are not exceeded.

In some embodiments of the invention, the fuel cell voltage monitoring circuit 18 may be replaced by a fuel cell voltage monitoring circuit 200. The fuel cell voltage monitoring circuit 200 has a similar design to the fuel cell voltage monitoring circuit 18, with the differences being pointed out below. In particular, each voltage scanning unit 24 of the fuel cell voltage monitoring circuit 18 is replaced by a corresponding voltage scanning unit 240 of the fuel cell voltage monitoring circuit 200. The ground references of the voltage scanning units 240 are connected to different nodes of the stack 20, similar to the voltage scanning units 24. However, unlike the voltage scanning units 24, each voltage scanning unit 240 does not have a processor 42 to direct the scanning of the cells 22 in its associated group. Instead, the voltage scanning units 240 respond to a selection signal that is provided by a circuit 201 that replaces the main processor 29 of the fuel cell voltage monitoring circuit 18.

More particularly, a processor 229 (a microprocessor, for example) of the circuit 201 provides the selection signal (a digital signal, for example) to selection lines 31 that are coupled to the voltage scanning units 31. As described in more detail below, the selection signal identifies one or more fuel cells 22 to be scanned. Thus, when the selection signal identifies a particular fuel cell 22, the voltage scanning unit 240 that is associated with the identified fuel cell (i.e., the identified fuel cell is within its associated group) measures the voltage of the cell and provides an indication of this measured voltage to the circuit 201.

In some embodiments of the invention, this indication of the measured voltage is an analog voltage that appears on a voltage communication line 214 that replaces the serial bus 28 of the fuel cell voltage monitoring circuit 18. As described below, the fuel cell voltage monitoring circuit 200 may, in some embodiments of the invention, include multiple voltage communication lines 214, each of extends to a different group of the voltage scanning units 240. Thus, in some embodiments of the invention, a different voltage communication line 214 may extend to each voltage scanning unit 240, and in some embodiments of the invention, a single voltage communication line 214 may extend to all of the voltage scanning units 240, as just a few examples.

Thus, as compared to the fuel cell voltage monitoring circuit 18, the fuel cell voltage monitoring circuit 200 may be less expensive and complex, as the circuit 200 may have just a single microprocessor in contrast to a microprocessor for each voltage scanning unit 240. Furthermore, less delay may be associated with scanning the fuel cell voltages. For example, when the processor 229 selects one or more fuel cells, the voltage scanning unit(s) 240 respond(s) by scanning the selected cell(s) and providing indications of the measured voltage(s) to the circuit 201 without waiting for a query from another circuit.

Besides the processor 229, in some embodiments of the invention, the circuit 201 may include a sample and hold (S/H) circuit 204 that is coupled to the voltage communication line 214 to sample the analog voltage from the line 214 and provide the sampled version of the voltage to an analog-to-digital (A/D) converter 205 for conversion to a digital indication. For multiple voltage communication lines 214, the circuit 201 may include multiple S/H circuits 204 and A/D converters 205 or may include multiplexing circuitry to multiplex the analog voltages from the lines 214 to a single S/H circuit 204 that is coupled to a single A/D converter 205. Other variations are possible.

Figure 3:
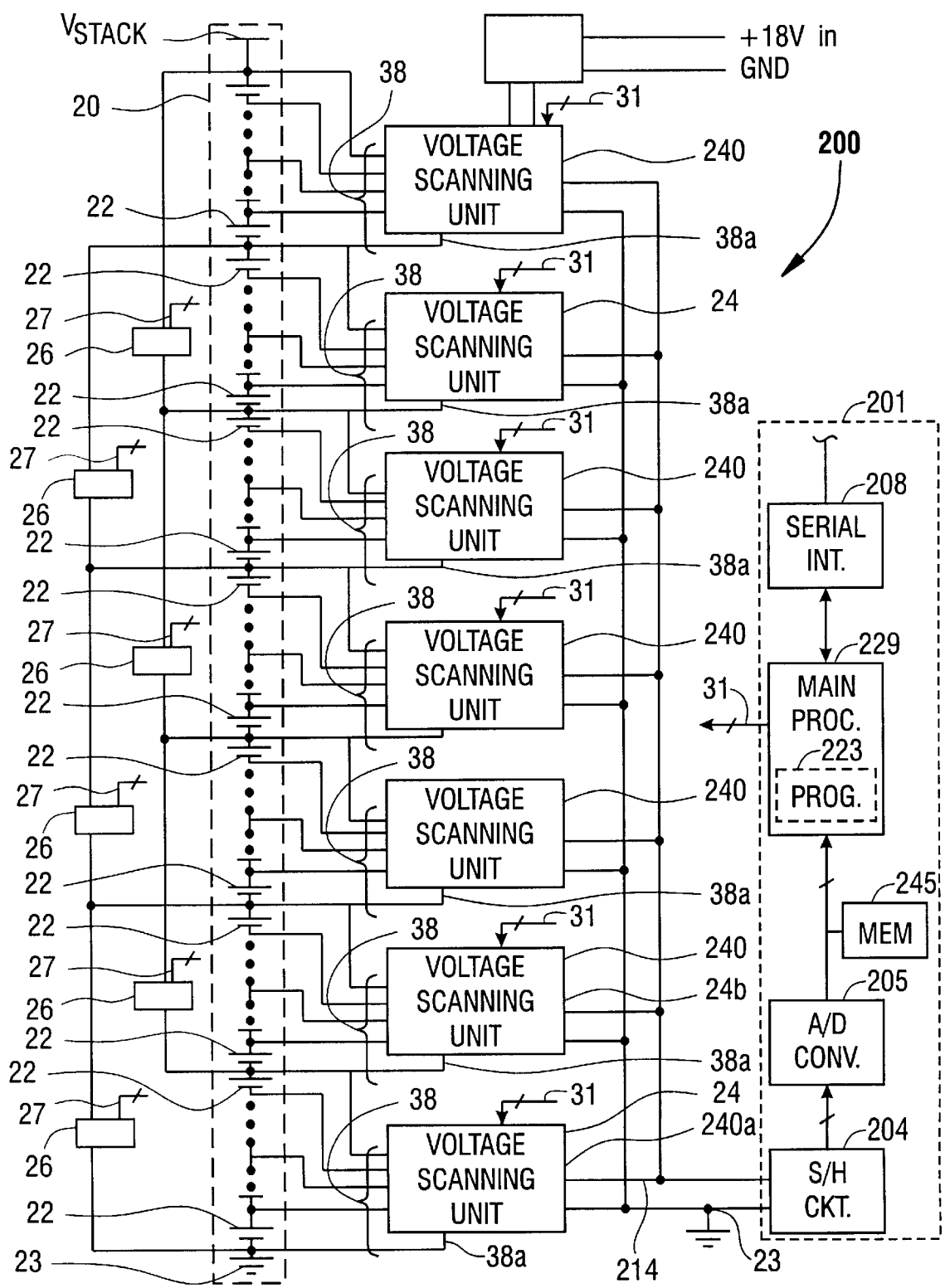
FIG. 3 is a schematic diagram of a circuit to measure fuel cell voltages according to another embodiment of the invention.

The circuit 201 may also include a memory 245 to store the digital indications of the measured cell voltages. The memory 245 may, for example, be integrated with the processor 229 or may be a separate discrete memory, as depicted in FIG. 3. In some embodiments of the invention, the circuit 201 may include a serial interface 208 that the processor 229 uses to communicate with other circuitry. For example, in some embodiments of the invention, the circuit 201 and the voltage scanning units 240 may be formed on the same printed circuit board, and the processor 229 may control the circuit and the voltage scanning units 240 for purposes of scanning the cell voltages of the stack 20. However, the processor 229 may not perform any analysis of the measured voltages. Instead, in some embodiments of the invention, the processor 229 may communicate indications of these measured voltages via the serial interface 208 to another printed circuit board or a computer (as examples) that processes the measured voltages for purposes of evaluating the health of the fuel cell stack 20 (for example). In some embodiments of the invention, the processor 229 may also perform the analysis of the measured voltages in addition to directing the measurement of the voltages of the fuel cells.

The processor 229 may store instructions that form a program 223 that, when executed by the processor 229, causes the processor 229 to perform one or more of the techniques that are described below. The program 223 may be stored in a memory (a read only memory (ROM)) of the processor 229 or may be stored in a separate discrete memory, as just a few examples.

Figure 4:
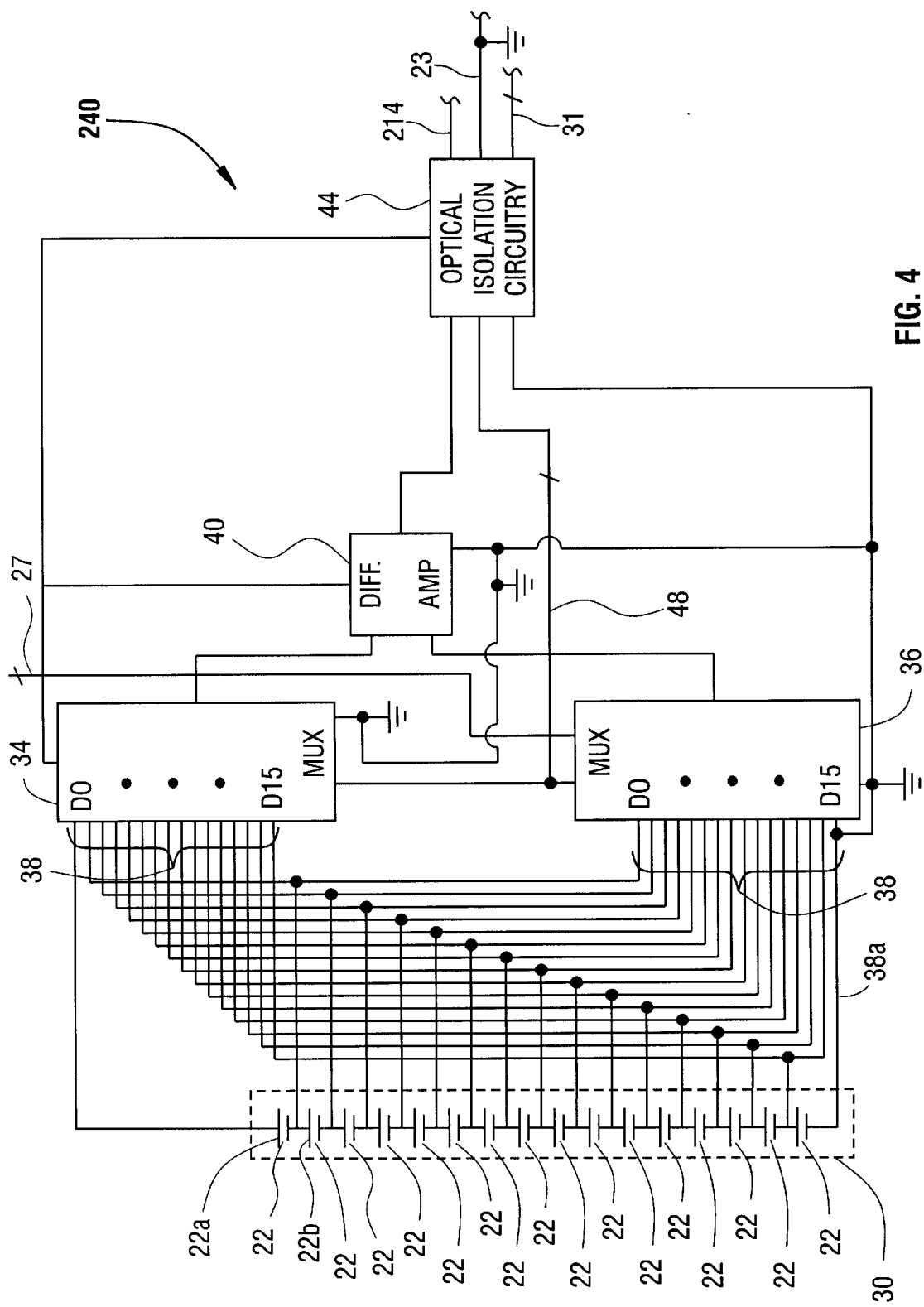
FIG. 4 is a schematic diagram of a scanning unit of the circuit of FIG. 3 according to an embodiment of the invention.

Referring to FIG. 4, the voltage scanning unit 240 has a similar design to the voltage scanning unit 24, with the differences being pointed out below. In particular, the voltage scanning unit 240 does not include the processor 42 of the voltage scanning unit 24. Instead, the output terminal of the differential amplifier 40 is coupled to the optical isolation circuitry 44. Furthermore, the control lines 28 are coupled to the optical isolation circuitry 44. Thus, due to this arrangement, the optical isolation circuitry 44 produces an analog signal on the voltage communication line 214 in response to the analog signal that appears at the output terminal of the differential amplifier. The optical isolation circuitry 44 also produces communicates indications of the signals from the selection lines 31 to the control lines 48 so that the multiplexers 34 and 36 are directly controlled by the digital signal is provided (a bit on each of the selection lines 31) to the selection lines 31 by the processor 229 (see FIG. 3).

In some embodiments of the invention, the output terminal of the differential amplifier 40 may be directly coupled to one of the communication lines 314, and the optical isolation circuitry 44 may not be used to communicate the signal from the output terminal to the communication line 314. In some embodiments of the invention, the differential amplifier 40 may be an operational amplifier that is capable of receiving a common mode voltage at either input terminal up to one hundred volts, and the ground of the differential amplifier may be coupled to the stack ground instead of to one of the nodes of the stack. Other variations are possible.

Figure 5:
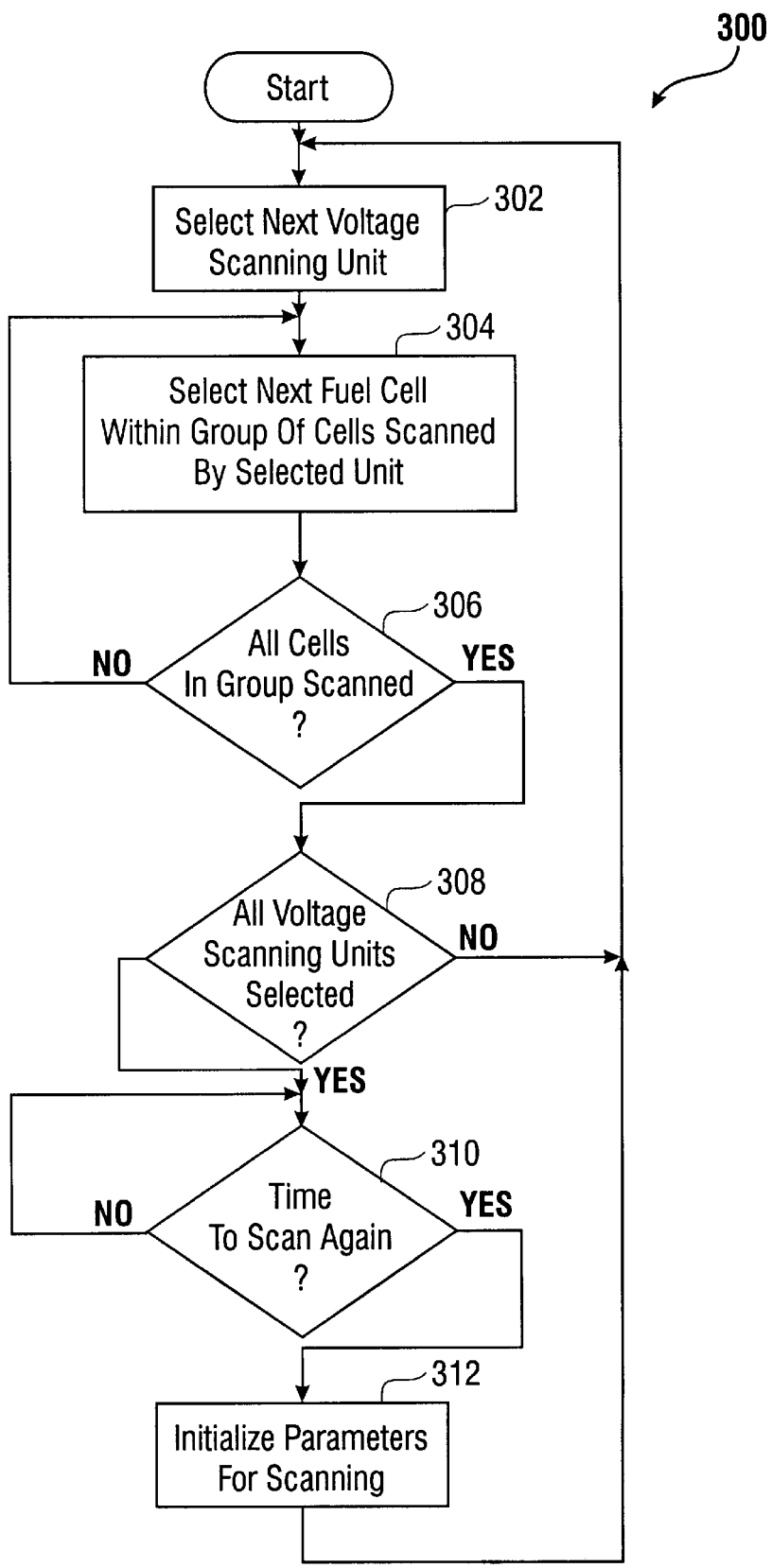
FIGS. 5, 6 and 7 are flow diagrams depicting different techniques to scan the fuel cell voltages according to different embodiments of the invention.
Figure 6:
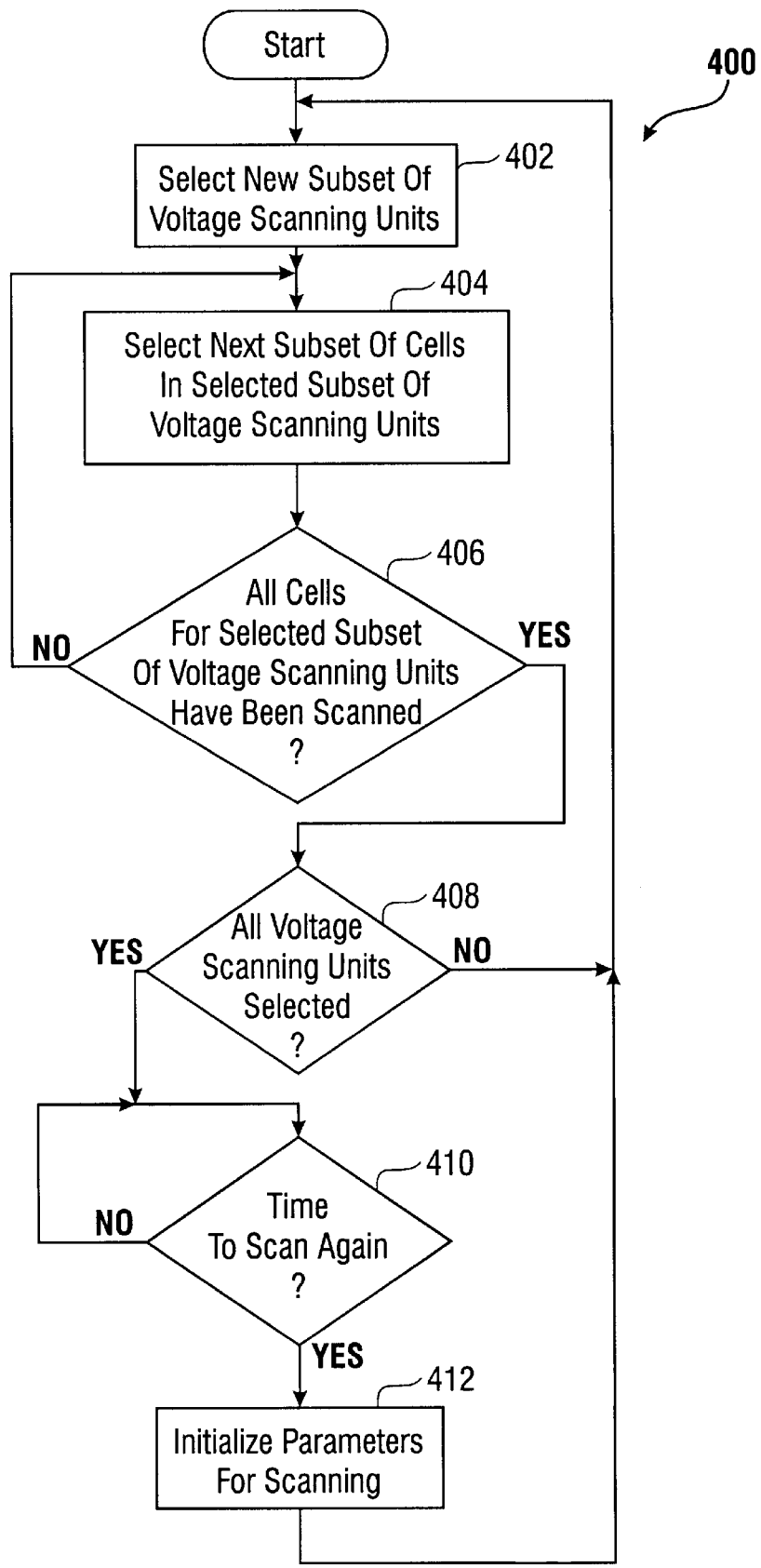
Figure 7:
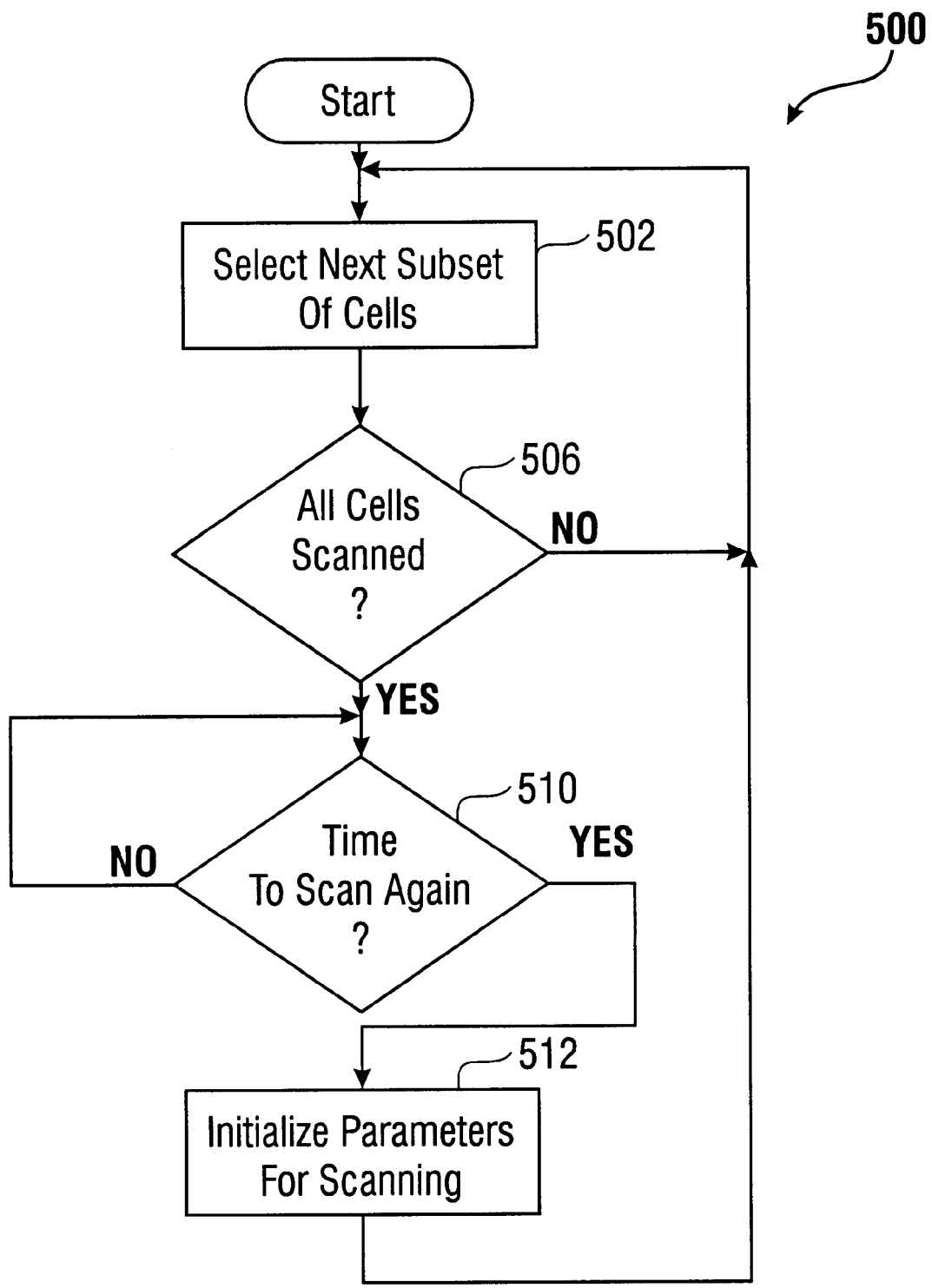

The cell voltages of the stack 20 may be scanned using several techniques, some of which are depicted in FIGS. 5, 6 and 7. In this manner, FIG. 5 depicts a technique 300 for scanning the cell voltages one at a time, a technique 300 that may use only one voltage communication line 214. In the technique 300, the processor 229 selects (block 302) the next voltage scanning unit 240 via the selection lines 31 and then begins a sequential scan of the voltages of the cells that are associated with the selected voltage scanning unit 240. As an example, the higher bit order selection lines 31 may be used to select the voltage scanning unit 240, and the lower bit order selection lines 31 may be used to select the cells in the group that is associated with the selected voltage scanning unit 240. Thus, in general, the processor 229 selects (block 304) the next fuel cell with the group associated with the selected voltage scanning unit 240, and in response, the selected voltage scanning unit 240 provides an indication of the measured voltage to the voltage communication line 214.

Next, the processor 229 determines (diamond 306) whether all cells in the group have been scanned, and if not, control returns to block 304. Otherwise, the processor 229 determines (diamond 308) whether all voltage scanning units 240 have been selected. If not, the processor 229 returns to block 302. Otherwise, the scan is complete. The processor 229 may subsequently determine (diamond 310) if it is time to scan again. For example, the processor 229 may receive a periodic interrupt request for purposes of "waking up" the processor 229 to perform the scan. Alternatively, the processor 229 may receive a request via the serial interface 208 to scan the cells. Other variations are possible. After the processor 229 determines that is time to scan the cells again, the processor 229 initializes (block 312) the parameters used for scanning, and control returns to block 302.

FIG. 6 depicts another technique 400 for scanning the cell voltages. In the technique 400, the processor 229 selects a subset of the voltage scanning units 240 and then sequentially selects cells from the groups of cells associated the selected subset of voltage scanning units 240

In the technique 400, the processor 229 selects (block 402) the next subset of voltage scanning units 240 via the selection lines 31 and then begins a sequential scan of the voltages of the cells that are associated with the selected voltage scanning units 240. As an example, the processor 229 may select four (as an example) of the voltage scanning units 240 and a specific cell ("cell number one," for example) to be scanned by each of these voltage scanning units 240. Thus, continuing the example, the voltage scanning units 240 provide indications of four measured cell voltages to the circuit 201 via four voltage communication lines 214. Next, the processor 229 may select a cell number two (for example) from each of these units 240, and the voltage scanning units 240 provide indications of the next four measured cell voltages (each measured from a cell number two of a different group) to the circuit 201 via the four voltage communication lines 214.

Thus, in general, in the technique 400, the processor 229 selects (block 404) the next subset of fuel cells for the selected subset of voltage scanning units 240, and in response, the selected voltage scanning units 240 provides indications of the measured cell voltages to the voltage communication lines 214.

Next, the processor 229 determines (diamond 406) whether all cells for the selected subset of voltage scanning units 240 have been scanned, and if not, control returns to block 304. Otherwise, the processor 229 determines (diamond 408) whether all voltage scanning units 240 have been selected. If not, control returns to block 402. Otherwise, the scan is complete. The processor 229 may subsequently determine (diamond 410) if it is time to scan again. If so, the processor 229 initializes (block 412) the parameters used for scanning, and control returns to block 402.

FIG. 7 depicts yet another technique 500 for scanning the cell voltages. In the technique 500, the processor 229 concurrently selects cells from all of the groups of fuel cells. For example, for each selection, each voltage scanning unit 240 may respond by measuring and indicating a voltage of a particular cell from its associated group. Therefore, as an example, if each group of cells contains sixteen cells, then the processor 229 uses sixteen different selections to scan the voltages of all of the cells of the stack 20.

In general, in the technique 500, the processor 229 selects (block 502) the next subset of cells, a selection involves concurrently selecting a different cell from each group of cells. Next, the processor 229 determines (diamond 506) whether all of the cells have been scanned, and if not, control returns to block 502. Otherwise, the processor 229 determines (diamond 510) if it is time to scan again. If so, the processor 229 initializes (block 512) the parameters used for scanning, and control returns to block 402.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A system usable with a stack of fuel cells that have cell terminals, comprising:
    a circuit to provide a selection signal indicating selection of at least one of the fuel cells for a voltage measurement; and
    scanning units adapted to be coupled to the stack to establish different groups of the fuel cells, each group being associated with a different one of the scanning units and each scanning unit having a ground referenced to a different one of the cell terminals and being adapted to in response to the selection signal, measure and indicate a voltage of each selected fuel cell within the group of fuel cells associated with said each scanning unit.

2. The system of claim 1, wherein each state of the selection signal selects fuel cells from different groups.

3. The system of claim 1, wherein the circuit comprises a microprocessor.

4. The system of claim, wherein each scanning unit furnishes a different analog signal to indicate the measured voltage, the system further comprising:
    an analog to digital converter to convert the analog signals into digital indications of the measured voltages.

5. The system of claim 1, wherein the circuit and the stack have a common ground connection.

6. The system of claim 1, wherein the ground of at least one of the scanning units is connected to the cell terminal of one of the cells in the associated group.

7. The system of claim 1, wherein at least one of the scanning unit s has an associated maximum input voltage that is less than the voltage of at least one of the terminals of the associated group with respect to a ground of the fuel cell stack.

8. The system of claim 7, wherein the maximum input voltage is between approximately 16 to 30 volts.

9. The system of claim 1, further comprising:

voltage regulators, each regulator providing power to at least one of the scanning units and having a ground in common with the ground associated with one of said at least one of the scanning units.

10. The system of claim 1, wherein at least one of the scanning units comprises:

a differential amplifier adapted to measure the voltages of the fuel cells in the associated group and provide an analog signal indicating the measurements; and multiplexing circuitry to, in response to the selection signal indicating one of the fuel cells in the associated group, selectively couple the terminals of the fuel cell indicated by the selection signal to the differential amplifier.

11. The system of claim 10, wherein said at least one of the scanning units further comprises:

optical isolation circuitry to communicate the analog signal to the circuit.

12. The system of claim 1, wherein said at least one of the scanning units does not comprise a microprocessor.

13. A system usable with a serially coupled array of voltage sources that have terminals, comprising:

a circuit to provide a selection signal indicating selection of at least one of the voltage sources for a voltage measurement; and scanning units adapted to be coupled to the array to establish different groups of the voltage sources, each group being associated with a different one of the scanning units and each scanning unit having a ground referenced to a different one of the terminals and being adapted to in response to the selection signal, measure and indicate a voltage of each selected voltage source within the group of voltage sources associated with said each scanning unit.

14. The system of claim 13, wherein each state of the selection signal selects voltage sources from different groups.

15. The system of claim 13, wherein the circuit comprises a microprocessor.

16. The system of claim 13, wherein each scanning unit furnishes a different analog signal to indicate the measured voltage, the system further comprising:

an analog to digital converter to convert the analog signals into digital indications of the measured voltages.

17. The system of claim 13, wherein the circuit and the array have a common ground connection.

18. The system of claim 13, wherein the ground of at least one of the scanning units is connected to the terminal of one of the voltage sources in the associated group.

19. The system of claim 13, wherein at least one of the scanning units has an associated maximum input voltage that is less than the voltage of at least one of terminals of the associated group with respect to a ground of the array.

20. The system of claim 13, wherein the array comprises a fuel cell stack.

21. The system of claim 13, wherein the array comprises a battery bank.

22. The system of claim 13, further comprising:

voltage regulators, each regulator providing power to at least one of the scanning units and having a ground in common with the ground associated with one of said at least one of the scanning units.

23. The system of claim 13, wherein at least one of the scanning units comprises:

a differential amplifier adapted to measure the voltages of the voltage sources in the associated group and provide an analog signal indicating the measurements; and multiplexing circuitry to, in response to the selection signal indicating one of the voltage sources in the associated group, selectively couple the terminals of the voltage source indicated by the selection signal to the differential amplifier.

24. The system of claim 23, wherein said at least one of the scanning units further comprises:

optical isolation circuitry to communicate the analog signal to the circuit.

25. A method usable with a stack of fuel cells, comprising:

dividing the fuel cells into groups;

establishing ground references at the different terminals of the cells, each ground reference being associated with one of the groups;

providing a selection signal to scanning units associated with the groups, the selection signal indicating selection of at least one of the cells; and in response to the selection signal, using at least one of the scanning units to measure the one or more voltages of said at least one of the cells indicated by the selection signal.

26. The method of claim 25, wherein the ground reference that is associated with at least one of the scanning units is connected to the terminal of one of the cells in the associated group.

27. The method of claim 25, wherein the act of measuring comprises:

measuring the voltages one at a time.

28. The method of claim 25, wherein the act of measuring comprises:

concurrently measuring the voltages of fuel cells of different groups in response to the selection signal.

29. The method of claim 25, wherein the act of measuring comprises:

concurrently measuring the voltages of fuel cells of all of the groups in response to the selection signal.

* * * * *

UNITED STATES PATENT AND TRADEMARK OFFICE
CERTIFICATE OF CORRECTION

PATENT NO. : 6,281,684 B1  Page 1 of 1
DATED : August 28, 2001
INVENTOR(S) : David E. James It is certified that error appears in the above-identified patent and that said Letters Patent is hereby corrected as shown below:

<u>Column 8,</u>
Line 61, after "claim", insert -- 1 --.

Signed and Sealed this

Eighteenth Day of June, 2002

Attest:

JAMES E. ROGAN
Attesting Officer  Director of the United States Patent and Trademark Office